United States Patent [19]

Damen et al.

[11] 4,395,769
[45] Jul. 26, 1983

[54] TUNABLE SEMICONDUCTOR LASER

[75] Inventors: Theodoor C. Damen, Colts Neck; Michel A. Duguay, Fair Haven, both of N.J.

[73] Assignee: Bell Telephone Laboratories, Incorporated, Murray Hill, N.J.

[21] Appl. No.: 240,206

[22] Filed: Mar. 3, 1981

[51] Int. Cl.³ .............................................. H01S 3/18
[52] U.S. Cl. ........................................ 372/7; 372/20; 372/43
[58] Field of Search .......................... 372/43, 7, 20, 66

[56] References Cited

U.S. PATENT DOCUMENTS 3,675,151 7/1972 Mack ..................................... 372/54
3,747,021 7/1973 Smiley ................................ 372/7 X
4,187,475 2/1980 Wieder ................................. 372/54

OTHER PUBLICATIONS

Fox et al., "Modes in a Maser Interferometer with Curved and Tilted Mirrors", *Proceedings of the IEEE*, Jan. 1963, pp. 80-89.
Liao et al., "Magnetic Field-and Concentration-Dependent Photo Echo Relaxation in Ruby with Simple Exponential Delay", *Optics Communications*, vol. 8, No. 4, Aug. 1973, pp. 310-311.
Passner et al., "Ultra: 4 Short Laser: Lasing in MBE GaAs Layer with Perpendicular-to Film Optical Excitation and Emission", *Technical Memorandum*, No. 79-1115-2, Jan. 3, 1979, pp. 1-11.

*Primary Examiner*—James W. Davie
*Attorney, Agent, or Firm*—Michael B. Einschlag; Erwin W. Pfeifle

[57] ABSTRACT

Tunable laser radiation is obtained by pumping a wedge-shaped ultra-short laser cavity with picosecond excitation pulses. Continuous tuning of the laser is achieved by translating either the wedge-shaped laser cavity or the excitation pulses so that different volumes of the laser material are exposed to the excitation pulses. In one embodiment utilizing picosecond laser excitation pulses the wedge-shaped laser cavity is a slightly wedged film of GaAs coated on both sides with dielectric mirrors.

16 Claims, 8 Drawing Figures

TUNABLE SEMICONDUCTOR LASER

BACKGROUND OF THE INVENTION

The present invention pertains to the field of tunable lasers.

Existing schemes for tuning lasers involve bulky arrangements which incorporate prisms and/or gratings. New applications for tunable lasers are developing in areas such as pollution detection, industrial spectroscopy, and blood analysis, which applications require compact tunable lasers.

SUMMARY OF THE INVENTION

Broadband tunable laser radiation is produced by pumping a wedge-shaped thin film of semiconductor material sandwiched between two mirrors, one of which mirrors comprises wedged thin dielectric films with high intensity excitation pulses having an ultra-short time duration. The time duration of the excitation pulses should be less than or substantially equal to a picosecond. The intense excitation heats up the electron-hole plasma and the crystal lattice, so that after a short time it is not possible to get laser action over the full bandwidth because the gain bandwidth and the gain amplitude have been severely reduced by a temperature increase in the crystal. Correspondingly, the thickness of the material should be less than or substantially equal to 1 $\mu$m. Continuous tuning of the laser radiation is achieved by either translating the wedge-shaped thin film structure or the excitation pulses so that different volumes of the semiconductor material are exposed to the excitation pulses. In one embodiment of the present invention, which embodiment utilizes picosecond laser excitation pulses, the wedge-shaped laser cavity comprises a slightly wedged film of GaAs coated on one side with a wedged dielectric mirror and on the other side with a conventional dielectric mirror.

BRIEF DESCRIPTION OF THE DRAWING

A complete understanding of the present invention may be gained from a consideration of the detailed description presented hereinbelow in connection with the accompanying diagram in which.

DETAILED DESCRIPTION

Figure 1:
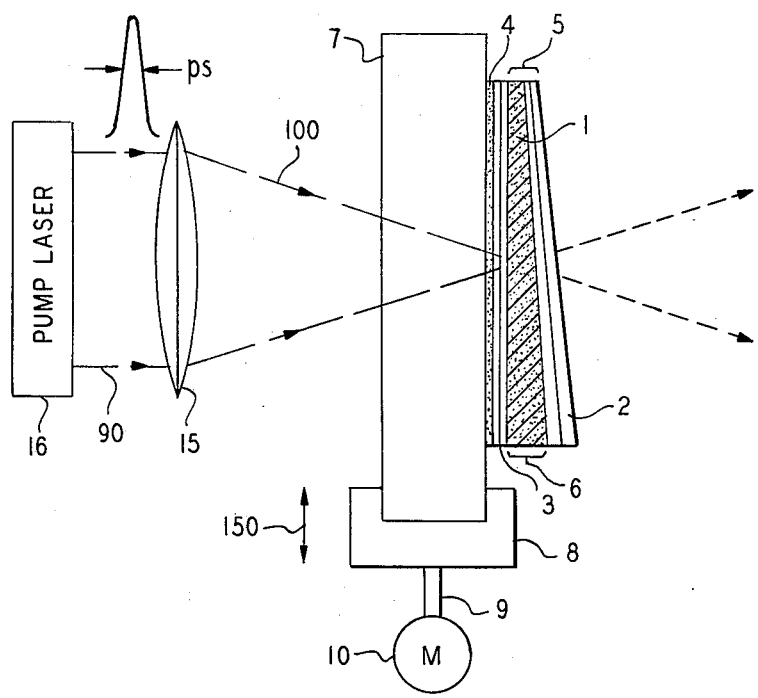
FIG. 1 shows, in pictorial form, an embodiment of the present invention which utilizes a GaAs wedge as a lasing material, a wedged dielectric output mirror and a picosecond laser excitation pulse to provide tunable laser radiation.

FIG. 1 shows an embodiment of the present invention which utilizes GaAs as a lasing material. The broadly tunable wedged laser has a slightly wedged film of GaAs, film 1, which is coated on both sides with dielectric mirrors 3 and 2, mirror 2 comprising wedged dielectric thin films. Dielectric mirror 3 is affixed by glue layer 4 to glass substrate 7. Glass substrate 7 is mounted in holder 8 and holder 8 is connected to movable arm 9. Movable arm 9 is connected to positioning means 10. Positioning means 10, for example a micrometer adjustment apparatus, changes the vertical position of the wedge-substrate assembly along the direction shown by arrow 150.

Pulse of radiation 90, provided by pump laser 16, is focused by lens 15 to produce beam 100. Beam 100 is focused so that it impinges upon a restricted volume of film 1 at room temperature. In one embodiment of the present invention, film 1 is pumped by 1 kw, 1 ps laser pulses of 615 nm wavelength from a mode-locked dye laser 16. We have pumped a Spectra-Physics synchronously pumped dye laser Model No. 343-02, equipped with a Spectra-Physics cavity dumper Model No. 344-5 with laser radiation from a Spectra-Physics argon laser Model No. 171-19, equipped with Spectra-Physics mode locker Model No. 342-501. These pulses are focused to a 4$\mu$ spot size by lens 15. The pump pulse has photons with an energy larger than the bandgap and produces laser action at energies far above the bandgap. This embodiment using GaAs is capable of producing tuning over the range of wavelengths between 780–890 nm by adjusting the position of holder 8 so that beam 100 is scanned over the full length of film 1. The output wavelength of the wedge laser changes linearly with distance along the direction indicated by arrow 150.

The 4$\mu$ spot size of beam 100 at the focus in film 1 provided a pumping power density on the order of 5 GW/cm$^2$. This pumping power density corresponds to a pumping energy flux of 5 mJ/cm$^2$ and produced an electron-hole pair density on the order of $2 \times 10^{20}$/cm$^3$. It is important to note that the relatively high quasi-fermi level of electrons and the nonequilibrium electron gas resulting from this high carrier density that produces gain over much larger bandwidths than are achieved in the usual injection-type semiconductor lasers. It is also important that the excitation pulses be less than or on the order of picosecond duration in order to prevent damage to the semiconductor material which would occur if the pulses were in the nanosecond range.

Effective operation of embodiments of the present invention requires ultra-short cavities in order that: 1. the appropriate electron-hole pair densities be generated in a volume of the laser material without damaging the material and 2. the photons generated can make a sufficient number of round-trips in the cavity to cause lasing before the electron-hole pair density decays.

(With crystal thicknesses in the range of 0.6–1.0 μm, ultrashort laser cavities were made that exhibited round-trip times of only 40–50 femtoseconds.)

The above-described conditions enable us to estimate the appropriate pulse duration for the excitation and the appropriate thickness of the semiconductor material. Of course, it should be clear to those skilled in the art that specific conditions depend on the semiconductor materials utilized. In order to achieve the shortest possible wavelength in a thin film GaAs laser, two conditions must simultaneously be met: 1. the pump pulse duration must be less than 10 picoseconds and 2. the semiconductor film thickness must be less than 3 microns.

The 10 ps pulse duration limit arises from the fact that the lifetime of the high-density electron-hole plasma in GaAs is limited by Auger recombination and by bimolecular recombination. The Auger recombination lifetime decreases with the square of the electron-hole density whereas the bimolecular recombination lifetime decreases linearly with carrier density. The observed result is that at electron-hole pair densities on the order of $2 \times 10^{20}$ electron-hole pairs per cc the population inversion has been sufficiently reduced 10 ps after pumping with a 1 ps pulse that laser action has been greatly reduced in power.

The 3 micron limit on thickness arises from the need to fill the whole thickness of the semiconductor film with the electron-hole plasma. Because of the high absorption coefficient of GaAs, the pump light is almost all absorbed in the first half-micron. Within a few picoseconds the electron-hole plasma expands to fill out the whole thickness. The speed of expansion has been observed to be on the order of 0.5μ per picosecond. In view of this, it is clear that for thickness exceeding 3μ the plasma expansion time will make the laser turn on at a time too late to take advantage of the full electron-hole population initially present. For a 3μ film the plasma expansion time is about 6 ps. If we add about 1 ps to this for laser buildup time we have a delay of 7 ps. In view of the 10 ps time limit discussed earlier, it is clear that 3μ is an upper limit on the thickness.

The generation rate of the electron-hole plasma should not exceed the optical breakdown of the material and the thickness of the laser material should be less than or substantially equal to the distance at which the electron-hole plasma produced fills most of the said thickness of laser material. This is done by bleaching through the material or by hydrodynamic expansion of the electron-hole plasma when bleaching is not possible.

Figure 2:
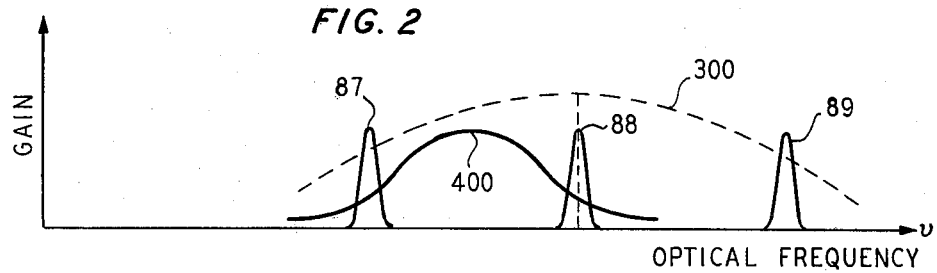
FIG. 2 shows, in graphical form, the contribution of the device components to the spectral output of the embodiment shown in FIG. 1 for excitation at the thin wedge end of the laser material.
Figure 3:
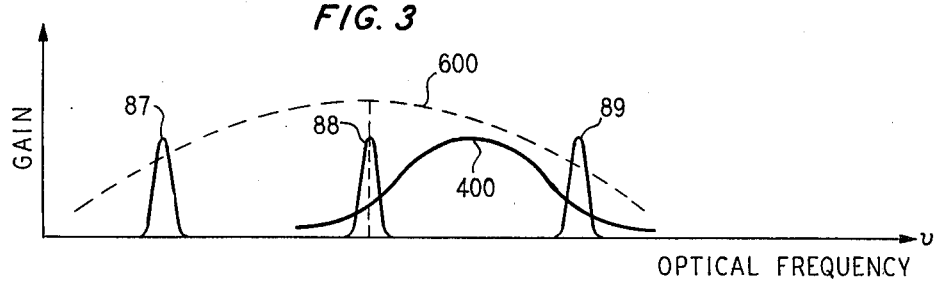
FIG. 3 shows, in graphical form, the contribution of the device components to the spectral output of the embodiment shown in FIG. 1 for excitation at the thick wedge end of the laser material.

The operation of the single-mode tunable wedged laser can be understood by referring to FIGS. 2 and 3. FIG. 2 shows how the spectral characteristics of laser gain curve 400, cavity modes 87, 88 and 89, and output mirror reflectivity 300 combine to allow only mode 88 to lase at the highest optical frequency obtainable. Mode 89 cannot lase because it falls outside gain curve 400. Mode 87, although lying within gain curve 400, cannot lase because output mirror reflectivity 300 is too low at that optical frequency to allow lasing.

Dielectric mirror 3 is a conventional high reflector which provides 98 percent or better reflectivity over the whole lasing range and has better than 70 percent transmission at the pump laser wavelength.

As a specific example, when GaAs film 1 in FIG. 1 is approximately 0.9μ thick at wedge-end 5, then approximately 8 half-waves of the lasing mode 88 are comprised within the GaAs film. At that point mode 88 has a lasing wavelength of about 0.78μ in air. Mode 87, if it were to lase, would have approximately 7 half-waves comprised within the GaAs film. As focussed pump light beam 100 is moved from wedge-end 5 to the thicker wedge-end 6, the spectral picture gradually changes so that the appropriate spectral characteristic is shown in FIG. 3. As the distance between mirrors 2 and 3 increases, mode 88, which fits about 8 half-waves within the GaAs, moves to longer wavelengths, i.e., to lower optical frequencies. As mode 88 moves to lower frequencies the thicknesses of the dielectric films in output mirror 2 change accordingly, so that the peak reflectivity of reflectivity curve 600 is maintained near the wavelength of mode 88. Mode 89, which has now moved within gain curve 400, is prevented from lasing by the low output mirror reflectivity of curve 600. As a specific example, GaAs film 1 in FIG. 1 is 1.02μ at wedge-end 6 and the lasing wavelength is approximately 0.89μ at that point. We do note that due to the high energy excitation mechanism it may be impossible to predict with absolute certainty the index of refraction of radiation in the lasing material. The exact wavelength at which a particular spot on the wedge lases can be determined by straightforward experimentation.

The highly reflecting dielectric mirror 3 could also be wedged so that its peak reflectivity would nearly follow the position of the desired mode 88. If this is done one must make sure that this mirror maintains everywhere a transmission of 70 percent or better at the pump laser wavelength.

An essential feature of the wedge laser is the extremely short distance between the mirrors, typically a few wavelengths. This short distance produces Fabry-Perot modes that are sufficiently far apart that only one mode falls within the spectral range where lasing action can be sustained. The lasing spectral range is determined by the gain spectrum of the active medium and by the spectral reflective characteristics of the dielectric coatings, as noted hereinabove.

Slightly wedged GaAs film 1, shown in FIG. 1, can be grown by LPE onto an $Al_{0.65}Ga_{0.35}As$ 4μ thick buffer layer, which buffer layer is grown on a GaAs substrate. One surface of the GaAs film is coated with dielectric layers 3, dielectric layers 3 having about 99 percent reflectivity at wavelengths between 780 and 890 nm. Dielectric layers 3 transmit 70 percent of the 615 nm laser output from pump laser 16. The GaAs wafer is then glued to glass substrate 7, as shown in FIG. 1. The wafer is then etched away by means of a "stop-etch" technique until only GaAs layer 1 remains. Wedged dielectric layers 2, which layers have a 95 percent reflectivity at the lasing wavelength, are then deposited on film 1. It should also be clear to those skilled in the art as to the appropriate cavity width conditions to utilize where the dielectric mirrors are glued to a wedged semiconductor instead of deposited thereon.

We also note that laser pulses as short as 0.7 ps can be obtained by optically pumping an ultrashort cavity GaAs laser with 1-ps pulses dumped out of a mode-locked dye laser. This result is obtained because a laser pumped within a time comparable to or less than the build-up time of the laser pulse from noise will tend to emit a pulse with a duration on the order of a few cavity round-trip times. This process has been referred to in the technical literature as "gain-switching" and has been observed in many types of lasers which emit nanosecond duration pulses. In order to extend the gain-switching technique to the picosecond time domain, both an ultrashort cavity and an ultrashort pumping pulse are required.

Figure 4:
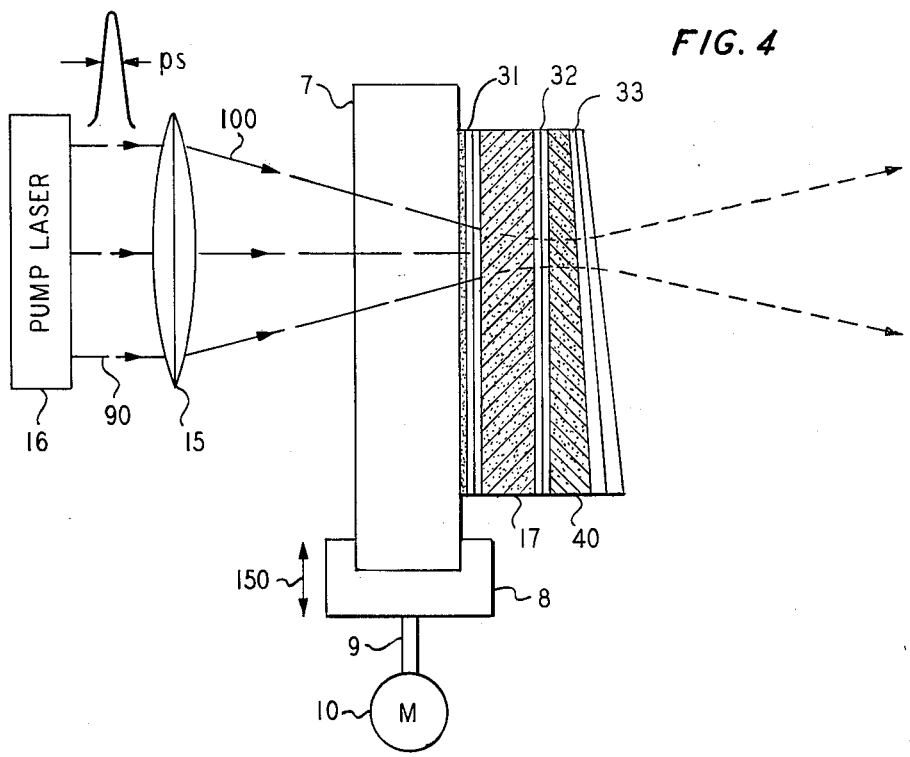
FIG. 4 shows, in pictorial form, a further embodiment of the present invention which utilizes laser pumping of a thin film laser to produce picosecond laser output, which picosecond laser output excites a wedged thin film laser structure.

The embodiment shown in FIG. 4 utilizes gain switching by pumping laser film 17, having substantially parallel sides, with the radiation from pump laser 16. The pulse of laser radiation provided by laser material 17 is shorter than the pulse of radiation in beam 100 provided by pump laser 16. This requires that the laser cavity formed by dielectric mirrors 31 and 32 be short enough so that gain switching occurs. For example we have been able to generate picosecond pulses in a Zn-doped single-crystal 0.6–2 μm thick GaAs ribbon which was sandwiched between highly reflecting dielectric mirrors with transparent epoxy to form a cavity 3–7 μm long.

The output of laser film 17 is used to pump laser wedge-film 40. The wedge assembly is movable, as described hereinabove with respect to the embodiment shown in FIG. 1, to provide tunable radiation. Specifying $\lambda_p$ as the wavelength of the output from pump laser 16, $\lambda_{17}$, as the output from film laser 17 and $\Delta\lambda_2$ as the range of outputs from wedge-laser 40 one specific embodiment of the invention as shown in FIG. 4 entails a design of dielectric mirrors 31, 32 and 33 such that: the reflectivity of mirror 31 is 99 percent at $\lambda_{17}$ and 20 percent at $\lambda_p$, the reflectivity of mirror 32 is 99 percent at wavelengths in the range $\Delta\lambda_2$ and 75 percent at $\lambda_{17}$ and the reflectivity of mirror 33 is 75 percent at wavelengths in the range $\Delta\lambda_2$. Utilizing a pump laser 16 with $\lambda_p = 6150$Å we would pump film 17, e.g., $Al_xGa_{1-x}As$, to provide $\lambda_{17} = 7500$Å. If the pulse width produced by pump laser 16 were 10 ps we would produce a pulse from film 17 of the order of 1 ps in width. This arrangement would provide a subpicosecond output from film 40.

Figure 5:
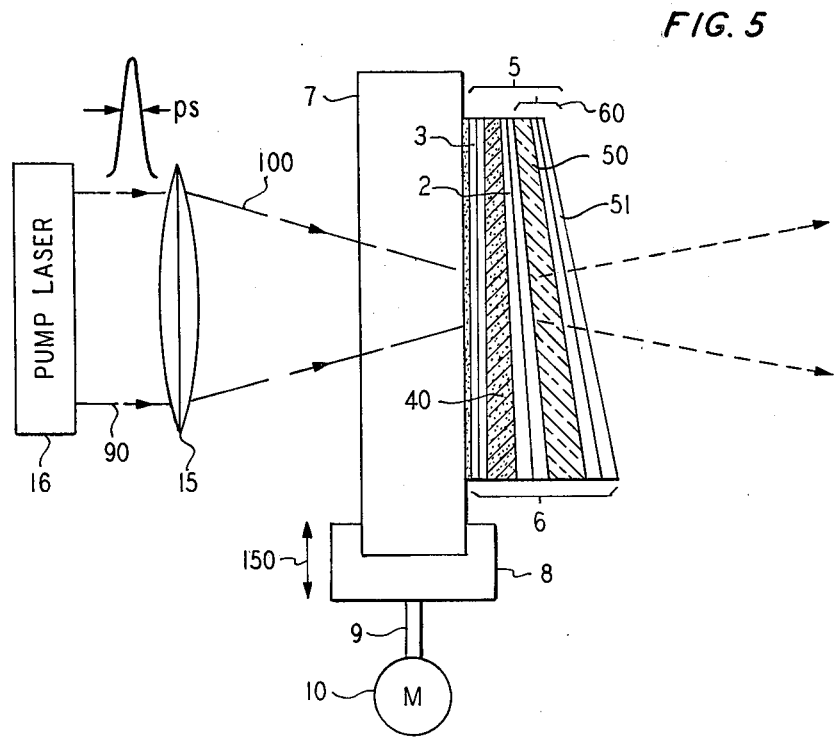
FIG. 5 shows, in pictorial form, a further embodiment of the present invention which utilizes a thin wedge of laser material sandwiched between a dielectric thin film high reflector and a wedged Fabry-Perot thin film outcoupling cavity.

FIG. 5 shows a further embodiment of the present invention which provides a narrower spectral width for the laser radiation output than that which is achievable from the embodiment shown in FIGS. 1 or 4. The structure includes second wedge 60 to provide a double cavity. Wedge 60 comprises a transparent dielectric wedge 50 and dielectric mirror 51. Dielectric mirror 3 is designed to transmit radiation at the wavelength provided by pump laser 16 and reflect 99 percent of the radiation produced by wedged laser film 40. Dielectric mirrors 2 and 51 are designed to reflect 75 percent of the radiation produced by wedged laser film 40. The effect of the addition of wedge 60 to the wedge laser embodiment shown in FIG. 1 is to sharpen the output pulse considerably. In fact, we would expect that the embodiment shown in FIG. 5 is capable of producing an output pulse which is no more than 1Å in width.

The length of the cavity between mirrors 2 and 51 is made substantially longer than the length of the cavity between mirrors 3 and 2 in order to increase the wavelength selectivity of the output. The transit time of laser photons in the double-cavity laser is now longer than the transit time in the single-cavity embodiment and the laser output pulse is correspondingly longer in accordance with the anticipated narrower linewidth. In order to achieve smooth tuning as a function of position along the direction of arrow 150, the mirror spacing of the cavity between mirrors 2 and 51 has to increase gradually from end 5 to end 6 in proportion to the increase in the spacing of the cavity between mirrors 3 and 2. The wedged dielectric mirrors 2 and 51 have thicknesses which increase gradually from wedge-end 5 to wedge-end 6 in order to maintain the ideal reflectivity at the lasing wavelength.

Figure 6:
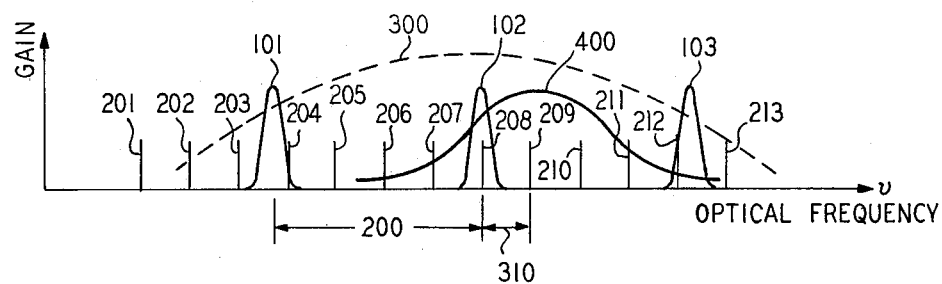
FIG. 6 shows a graphical representation of the contribution of the device components to the spectral output of the embodiment shown in FIG. 5.

In FIG. 6 curve 400 represents the induced-gain curve of laser film 1. Curves 101, 102 and 103 show the position of the modes provided by the cavity between mirrors 3 and 2 when film 1 is pumped near wedge-end 6 in FIG. 1. This shows the width of the spectral output produced by the embodiment of FIG. 1, which output is represented by the overlap of curve 102 and curve 400. The overlap of curves 102 and 400 also shows that the embodiment of FIG. 1 provides single mode output (mode 102) because the adjacent modes 101 and 103 fall in a region where the mirror reflectivity of output mirror 2, curve 300, and the gain have decreased to such an extent that lasing is not possible.

Curves 201–213 show the positions of the modes provided by the cavity between mirrors 2 and 51 in FIG. 5 where film 40 is analagous to film 1 of FIG. 1. The laser output of the embodiment shown in FIG. 5 occurs where curves 400, 102 and 208 overlap and is therefore considerably narrowed from the output provided by the overlap of curves 400 and 102. We note the distance between mirrors 2 and 51 should increase in proportion from wedge-end 5 to wedge-end 6 to insure that the mode shown by curve 102 coincides with the mode shown by curve 208 as the wedge is translated along the direction shown by arrow 150.

It should be noted that the Fabry-Perot structure can also be used to help prevent another mode (like mode 103 in FIG. 6) from lasing, should it fall within the gain curve. As shown in FIG. 6, none of the Fabry-Perot modes numbered 201 through 207 and 208 through 213, falls on a laser cavity mode. Also note that the Fabry-Perot output structure can have a spacing that is less in optical path length than the main laser cavity between mirrors 3 and 2. In this case the Fabry-Perot mode 209, for example, would fall at higher optical frequencies than main cavity mode 103, thereby preventing the latter from lasing.

Figure 7:
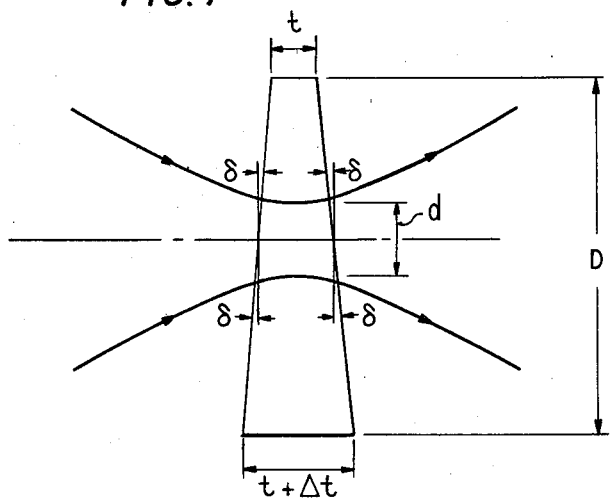
FIG. 7 shows, in pictorial form a wedged laser cavity and the extent of the deviation of the sides from parallelism in the region of excitation.

It should also be noted here that the amount of mirror tilt involved in the wedged laser is so small that the increase in the diffraction loss due to the tilt is virtually negligible. The excess diffraction loss due to tilt has been quantifed in an article entitled "Modes in a Master Interferometer with Curved and Tilted Mirrors" by A. G. Fox and T. Li in *Proc. IEEE*, Vol. 51, No. 1, January 1963, pp. 80–89, as a function of the tilt parameter $\delta$. The parameter $\delta$ is the excess of the tilted mirror spacing over the spacing of perfectly parallel mirrors, measured at the edge of the laser beam waist (see FIG. 7). It is convenient to express $\delta$ as a fraction of the laser wavelength in the medium. The important point to note is that the difference in mirror spacing $\Delta t$ in going from the narrow wedge end to the thicker end is on the order of half a wavelength ($\lambda/2$). Since the distance D shown in FIG. 7 is typically 5 mm, whereas the focused spot size (laser beam waist) is typically 5μ, we have that $\delta$ is typically $\delta = (\lambda/4)(d/D) = (\lambda/4)(1/1000)$.

The work of Fox and Li showed that when $\delta$ is less than $\lambda/144$ the excess diffraction loss of the tilted mirror resonator is less than 1 percent per pass for Fresnel numbers between 1 and 10, which values are applicable here.

In the case of the double cavity wedge laser in FIG. 5, the second cavity would have a $\delta$, say $\delta_2$, equal to $n\delta_1$, where n is the ratio of the two cavity lengths. Even for n=10, we are still talking about a $\delta_2 = \lambda/400$, which gives rise to a negligible increase in diffraction loss according to Fox and Li.

Figure 8:
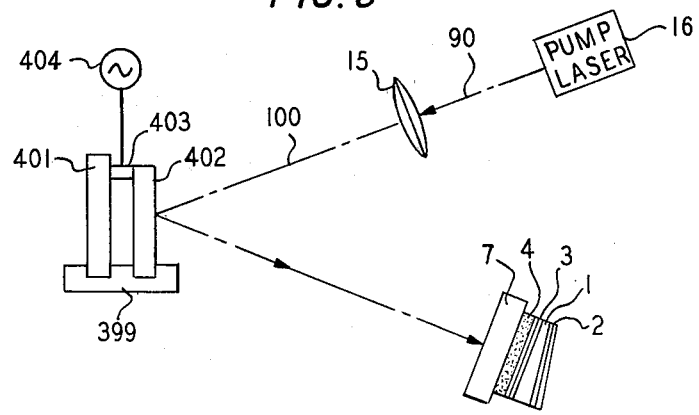
FIG. 8 shows, in pictorial form, an embodiment of the present invention which includes apparatus to scan the excitation pulse from a pump laser over a wedged thin film laser structure in order to provide tunable laser output.

It should be clear to those skilled in the art that the tuning of the laser output as shown in the embodiments of FIGS. 1, 4 and 5 may be achieved either by translating the wedge-shaped laser cavity so that an excitation pulse may impinge on different volumes of the laser material or by utilizing means for translating the excitation pulse. It should be clear to those skilled in the art as to the numerous apparatus which are available for translating the excitation pulse when it is in the form of laser output. For example, FIG. 8 shows mirror 402 which is attached to support 400 and piezoelectric material 403 which is attached to support 401. Both mirror 402 and support 401 are held in support 399. Voltage source 404 is used to energize piezoelectric material 403 so that beam 100 is deflected when mirror 402 is translated. This apparatus is but one example of a mechanism for translating the excitation pulse.

Of course it should be clear to those skilled in the art that further embodiments of the present invention would also utilize other semiconductor materials such as ternary and quaternary semiconductor III–V compounds and II–VI compounds such as CdSe. This would require photon energies in the pumping radiation larger than that of the bandgap of the particular semiconductor material. Pulse durations would also vary due to different damage thresholds and rate of recombination of electron-hole pairs. For example one can produce laser action in InGaAsP semiconductor material placed in similar structures, where, of course one would change the mirror reflectivities to be suitable for the wavelength range of $1.14$–$1.34\mu$ where such InGaAsP materials lase.

What is claimed is:

1. A laser which comprises:
   a thin film (1) of semiconductor material disposed between mirrors (2 and 3) and
   excitation means (15 and 16) for producing a population inversion in a predetermined volume of said semiconductor material
   characterized in that
   said thin film has a variation in thickness from a first end to a second end thereof and said excitation means provides high intensity excitation pulses having an ultra-short time duration, the time duration of said excitation pulse being less than or substantially equal to one picosecond, said thickness of said semiconductor material being less than or substantially equal to the distance at which the electron-hole plasma produced by said excitation pulse fills substantially all of said thickness of said material in said time duration, and at least one of said mirrors comprises at least one layer of material having a variation in thickness from a first end to a second end thereof.

2. A laser in accordance with claim 1 wherein said excitation means comprises means (15 and 16) for providing laser radiation, which laser radiation produces said population inversion.

3. A tunable laser in accordance with claim 2 which further comprises:
   means (7, 8, 9 and 10) for adjusting the position of said semiconductor material in such a manner that different predetermined volumes of said semiconductor material are exposed to said laser radiation, whereby said laser provides tunable laser output radiation.

4. A tunable laser in accordance with claim 2 which further comprises:
   means (399, 401–404) for adjusting the direction of said laser radiation in such a manner that different predetermined volumes of said semiconductor material are exposed to said laser radiation, whereby said laser provides tunable laser output radiation.

5. A tunable laser in accordance with claim 3 or 4 wherein said laser material is GaAs.

6. A tunable laser in accordance with claim 5 wherein said laser material is a wedge having a thickness substantially equal to $0.9\mu$ at one end of said wedge and a thickness substantially equal to $1.02\mu$ at the other end of said wedge.

7. A laser which comprises:
   a first thin film (17) of semiconductor material having sides which are substantially parallel and a thickness less than or substantially equal to 1 $\mu$m, said film being disposed between a first mirror (31) and a second mirror (32), said first and second mirrors being substantially parallel;
   a second thin film (49) of semiconductor material having a variation in thickness from a first end and a second end thereof less than or substantially equal to 1 $\mu$m, said second thin film being disposed between said second mirror and a third mirror (33), said third mirror comprises at least one layer of material having a variation in thickness from a first end and a second end thereof; and
   excitation means (15 and 16) for producing a population inversion in a predetermined volume of the semiconductor material of said first thin film, said excitation means provides high intensity excitation pulses of time duration less than or substantially equal to 10 picoseconds.

8. A laser in accordance with claim 7 wherein said excitation means comprises means (15 and 16) for producing laser radiation, which laser radiation produces said population inversion.

9. A tunable laser in accordance with claim 8 which further comprises:
   means (7, 8, 9 and 10) for adjusting the position of said first and second thin film so that different predetermined volumes of said first thin film of semiconductor material are exposed to said laser radiation, whereby said laser provides tunable laser output.

10. A tunable laser in accordance with claim 8 which further comprises:
    means (399, 401–404) for adjusting the direction of said laser radiation in such a manner that different predetermined volumes of said first thin film of semiconductor material are exposed to said laser radiation, whereby said laser provides tunable laser output.

11. A tunable laser in accordance with claim 9 or 10 wherein said first thin film and said second thin film of semiconductor material are GaAs and said second thin film is a wedge having a thickness substantially equal to $0.9\mu$ at one end of said wedge and a thickness substantially equal to $1.02\mu$ at the other end of said wedge.

12. A laser in accordance with claim 1 which further comprises:
    a film (50) of material substantially transparent to laser radiation output from said thin film, said film being disposed between the second mirror and a third mirror (51), said film having a second variation in thickness from a first end to a second end thereof, said second variation in thickness being larger than said variation in thickness and said variation in thickness and second variation in thickness being proportional to each other along the lengths of said thin film and said film.

13. A laser in accordance with claim 12 wherein said third mirror comprises at least one layer of material having a variation in thickness from a first end to a second end thereof.

14. A laser in accordance with claim 13 wherein said excitation means comprises means (15 and 16) for providing laser radiation, which laser radiation produces said population inversion.

15. A tunable laser in accordance with claim 14 which further comprises:

means (7, 8, 9 and 10) for adjusting the position of said semiconductor material in such a manner that different predetermined volumes of said semiconductor material are exposed to said laser radiation, whereby said laser provides tunable laser output radiation.

16. A tunable laser in accordance with claim 14 which further comprises:

means (399, 401-404) for adjusting the direction of said laser radiation in such a manner that different predetermined volumes of said semiconductor material are exposed to said laser radiation, whereby said laser provides tunable laser output radiation.

* * * * *